United States Patent [19]

Nakashima et al.

[11] Patent Number: 4,651,341
[45] Date of Patent: Mar. 17, 1987

[54] PATTERN RECOGNITION APPARATUS AND A PATTERN RECOGNITION METHOD

[75] Inventors: Masato Nakashima, Yokohama; Tetsuo Koezuka, Hachioji; Hiroyuki Tsukahara, Atsugi; Takefumi Inagaki, Kawasaki, all of Japan

[73] Assignee: Fujitsu Limited, Kawasaki, Japan

[21] Appl. No.: 531,563

[22] Filed: Sep. 13, 1983

[30] Foreign Application Priority Data

Sep. 14, 1982 [JP] Japan ................................. 57-160114

[51] Int. Cl.$^4$ ............................................. G06K 9/68
[52] U.S. Cl. .......................................... 382/34; 382/8; 382/37; 382/42
[58] Field of Search .................. 382/34, 33, 37, 48, 382/8, 42, 47, 56, 22, 31, 54; 381/41, 42, 43

[56] References Cited

U.S. PATENT DOCUMENTS

| | | | |
|---|---|---|---|
| 3,614,736 | 10/1971 | McLaughlin et al. | 382/34 |
| 4,074,231 | 2/1978 | Yajima et al. | 382/54 |
| 4,091,394 | 5/1978 | Kashioka et al. | 382/48 |
| 4,153,897 | 5/1979 | Yasuda et al. | 382/34 |
| 4,200,861 | 4/1980 | Hubach et al. | 382/34 |
| 4,334,241 | 6/1982 | Kashioka et al. | 382/8 |
| 4,450,579 | 5/1984 | Nakashima et al. | 382/8 |

OTHER PUBLICATIONS

J. S. Boland et al, "Design of a Correlator for Real-Time Video Comparisons", 1979.
P. S. Burggraff, "Pattern Recognition on Bonders and Probers", Semiconductor International, Feb. 1981, pp. 53-70.

Primary Examiner—Leo H. Boudreau
Attorney, Agent, or Firm—Armstrong, Nikaido, Marmelstein & Kubovcik

[57] ABSTRACT

A pattern recognition apparatus and method, the apparatus comprising a correlation calculating circuit for calculating first correlations between each part of a image pattern data and a reference pattern data, the first correlation being expressed as R(X), where X is a variable factor representing a region storing the part of the image pattern data, and also comprising a second correlation calculating circuit for recognizing the position of a pattern most identical to the reference pattern by emphasizing the maximum value of the first correlations by converting each of the first correlations R(X) into a second correlation expressed as $[R(X)-R(X-\alpha)]-[R(X+\alpha)-R(X)]$, where $\alpha$ is a predetermined value determined in accordance with the size of the reference pattern data.

15 Claims, 23 Drawing Figures

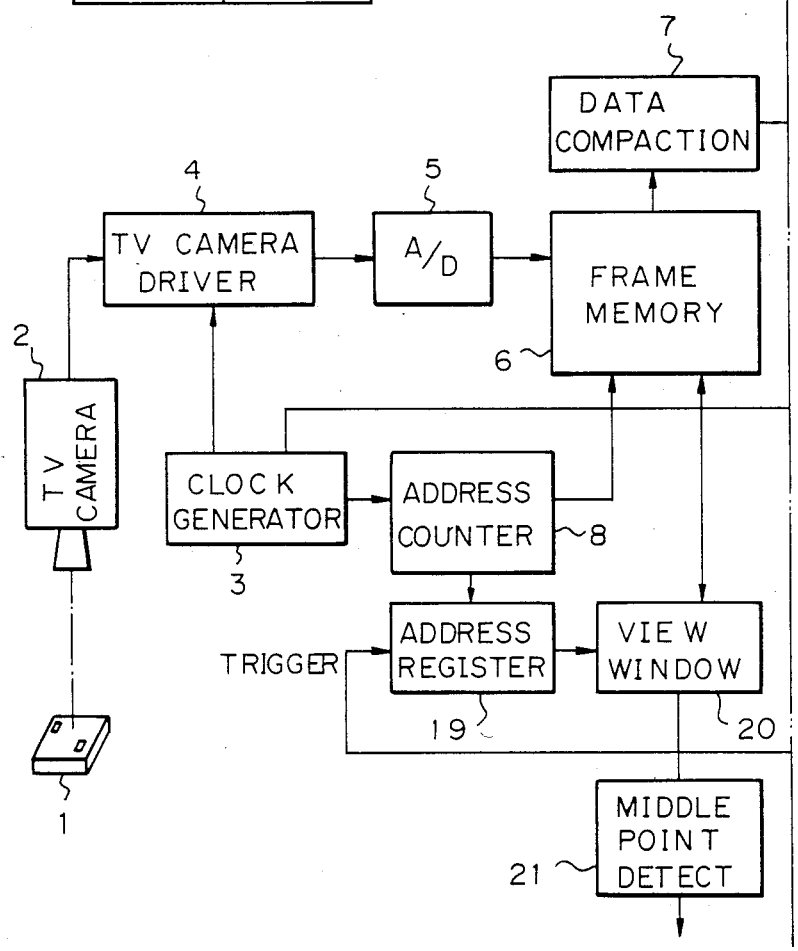

1b → 1b

2×2b → 1b

4×4b —— 1b

6×6b —— 1

PATTERN RECOGNITION APPARATUS AND A PATTERN RECOGNITION METHOD

BACKGROUND OF THE INVENTION

1. Field of the Invention

The present invention relates to a pattern recognition apparatus and a pattern recognition method, more particularly, to an apparatus and method for recognizing, with a high accuracy and a high speed, bonding lead patterns and bonding pad patterns (hereinafter referred to as lead patterns and pad patterns) of an integrated circuit (IC) or elements such as transistors, and diodes, formed on a hybrid IC substrate, so as to enable an efficient automatic wire bonding operation between the lead and the bonding pad.

2. Description of the Prior Art

One of the applications of an apparatus for detecting the position of patterns is in the field of automatic wire bonding for assembling a semiconductor IC or a semiconductor hybrid IC.

To accomplish successful automatic wire bonding in assembling a semiconductor hybrid IC (or semiconductor IC), it is desired that the position of each pad pattern of elements on the hybrid IC and the position of each lead pattern on the hybrid IC be detected both quickly and accurately. If the positions of the pad patterns and the lead patterns are not detected quickly and accurately, the assembly process will be delayed or the yield of products will be reduced.

Two methods are known for detecting lead patterns and pad patterns, i.e., a pattern matching method and a pattern feature extracting method (see, for example, Semiconductor International, February 1981, pp 53 to 70, "Pattern Recognition on Bonders and Probers", and Japanese Unexamined Patent Publication (Kokai) No. 55-187258 and U.S. Pat. No. 4,450,579). Both these methods have advantages and disadvantages when applied to a pattern-position recognizing apparatus used for assembling hybrid IC's. Thus, neither method is totally satisfactory when used in an automatic wire bonding apparatus.

In both of these conventional methods, the surface of a hybrid IC is scanned by a TV camera or the like to obtain image signals of the lead patterns or part of an element pattern including pad patterns. The image signals obtained by the scanning are converted into binary-coded signals.

In the conventional pattern matching method, the binary-coded data representing the scanned lead pattern or the part of the element are compared with the image data of a reference pattern of a standard sample whose position is previously known, by means of one-dimensional or two-dimensional correspondence, to determine correlations therebetween. When a correlation between the scanned pattern and the reference pattern is the maximum among all of the correlations, the position of the scanned pattern is identified.

In this conventional pattern matching method, however, there are several disadvantages. First, in the case of thick-film hybrid IC's, the lead patterns are formed by means of printing. Because of the printing, the surface of each lead pattern is too rough to find the maximum correlation in pattern matching. Thus, it is difficult to accurately detect the position of each lead pattern.

Second, if the element to be recognized is mounted on a substrate with a small rotation angle with respect to the standard sample, the binary-coded data representing the scanned pattern will not completely coincide with the image data of the reference pattern. This non-coincidence also occurs because of a production-prober's scratch on each lead pattern, or on each pad pattern, the scratch being inevitably formed during electrical testing of the IC or the hybrid IC before the wire bonding process. The scanned pattern generally does not coincide exactly with the reference pattern due to other noise as well. Under these circumstances, it is difficult to identify the scanned pattern which coincides with the reference pattern. Thus, the position of the scanned pattern may often be erroneously determined. In other words, the accuracy of the position detection is poor.

In the conventional pattern-feature extracting method, a specific shape, size, or area of a pattern is detected by, for example, extracting a pattern width and a middle point of the pattern with the use of a view-window determining circuit. This second method also has several disadvantages. As in the case of the first conventional method, it is difficult to determine the specific shape, size, or area of the rough surface of a lead pattern formed by printing. Also, erroneous positions may be determined when noise is introduced into the binary-coded data obtained by scanning a pattern. Further, a hybrid IC mounts various patterns of elements, such as rectangular-shaped patterns or egg-shaped patterns of IC's, transistors, diodes, etc., making it difficult to extract a specific feature. For example, it is difficult to determine the middle point of an egg-shaped pattern. Therefore, the feature extracting method is not adequate for recognizing a pattern on a hybrid IC.

SUMMARY OF THE INVENTION

Accordingly, an object of the present invention is to provide an apparatus and a method which can prevent erroneous detection of the position of a pattern laid on an object, by combining an improved pattern matching method and a feature extracting method.

Another object of the present invention is to provide an apparatus and method which can correctly detect the position of a lead pattern formed by printing.

Still another object of the present invention is to provide an apparatus and method which can correctly detect the position of a pattern even when the pattern is mounted with a small rotation angle with respect to a reference pattern or even when the pattern has scratches.

A still further object of the present invention is to provide an apparatus and method which can correctly identify a desired pattern from various patterns on an IC or hybrid IC.

A still further object of the present invention is to provide an apparatus and method effective for an automatic wire bonding operation in a semiconductor device.

To attain the above objects, there is provided a pattern recognition apparatus comprising an image pickup section for picking up an image of patterns; a pretreatment circuit for converting (quantizing) the outputs of the image pickup section into digitized image pattern data consisting of binary-coded signals; a pattern memory circuit having $N \times M$ addresses for storing $N \times M$ bits of the image pattern data, where M and N are integers; and a reference pattern memory circuit having at least $n \times m$ addresses for storing reference pattern data consisting of n×m bits of a reference pattern, where m and n are integers smaller than M and N respectively.

According to the invention, the apparatus further comprises a correlation calculating circuit for calculating first correlations between sub-images each consisting of n×m bits of the image pattern data and of the reference pattern data respectively, each of the first correlations being expressed as R(x), where X is a variable factor representing a memory region (e.g. address) storing one of the sub-images of the image pattern data in the pattern memory circuit; and a position recognizing means for recognizing the position of a pattern-most indentical to the reference pattern by emphasizing (e.g. enhancing) the maximum value of the first correlations by converting each of the first correlations R(x) into a second correlation expressed as $[R(x)-R(x-\alpha)]-[R(x+\alpha)-R(x)]$, where $\alpha$ is a predetermined value determined in accordance with the size of the reference pattern data.

According to one aspect of the present invention, the pattern recognition apparatus further comprises a data compaction circuit inserted between the pretreatment circuit and the pattern memory circuit, for compacting a predetermined number of neighboring uncompacted bits of the binary-coded image signals into a single compact bit, the sign of the single compact bit being determined in accordance with the number of "1" or "0" signals in the neighboring uncompacted bits, so as to provide compacted image pattern data to the pattern memory circuit.

According to the present invention, there is further provided a pattern recognition method comprising the steps of picking up an image of patterns; converting the picked-up image into digitized image pattern data consisting of binary-coded signals; storing N×M bits of the image pattern data, where M and N are integers; storing reference pattern data consisting of at least n×m bits of a reference pattern, where m and n are integers smaller than M and N, respectively; calculating first correlations between sub-images each consisting of n×m bits of the image pattern data and of the reference pattern data, respectively each of the first correlations being expressed as R(x), where X is a variable factor representing a memory region storing one of the sub-images of the image pattern data; and recognizing the position of a pattern most identical to the reference pattern, by emphasizing the maximum value of the first correlations by converting each of the first correlations R(x) into a second correlation expressed as $[R(x)-R(x-\alpha)]-[R(x+\alpha)-R(x)]$, where $\alpha$ is a predetermined value determined in accordance with the size of the reference pattern data.

The pattern recognition method according to the present invention may further comprise, after the step of converting the picked up image into digitized image pattern data consisting of binary-coded signals, the step of compacting a predetermined number of neighboring uncompacted bits of the binary-coded signals into a single compact bit, the sign of the single compact bit being determined in accordance with the number of "1" or "0" signals in the neighboring uncompacted bits, so as to provide compacted image pattern data.

BRIEF DESCRIPTION OF THE DRAWINGS

The above objects, advantages, and other features of the present invention will be more apparent from the following description of the embodiments when read in conjunction with the attached drawings, wherein.

DESCRIPTION OF THE PREFERRED EMBODIMENTS

Embodiments of the present invention will now be described with reference to the drawings.

Figure 1:
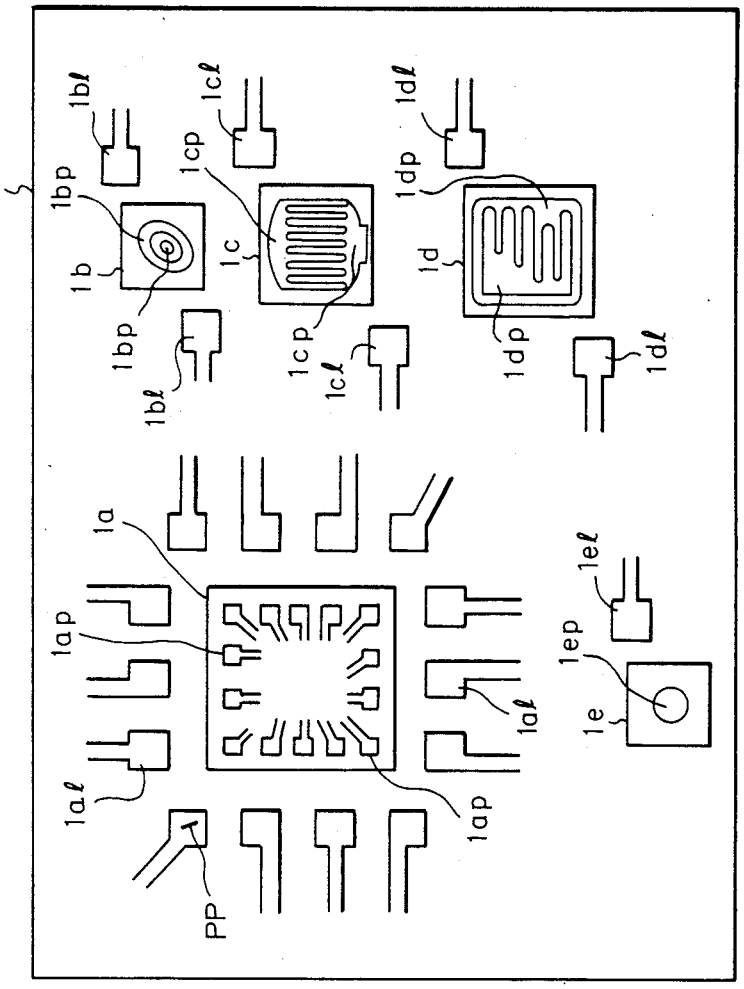
FIG. 1 is a plan view of a hybrid IC chip on which an embodiment of the present invention is applied.

FIG. 1 is a plan view of a hybrid IC chip on which an embodiment of the present invention is applied. In FIG. 1, on a hybrid IC substrate 1, patterns of various elements, such as an IC pattern 1a, transistor patterns 1b, 1c, and 1d, and a diode pattern 1e, are mounted. The IC pattern 1a has on its outer sides a number of pad patterns lap. On the periphery of the IC pattern 1a, a number of lead patterns 1al corresponding to the pad patterns lap are arranged. Similarly, the transistor pattern 1b has two pad patterns 1bp. On the periphery of the transistor pattern 1b, two lead patterns 1bl corresponding to the pad patterns 1bp are arranged. The transistor patterns 1c and 1d also have pad patterns 1cp and 1dp and lead patterns 1cl and 1dl on their peripheries. The diode pattern 1e has a pad pattern 1ep and, on its periphery, a lead pattern 1el.

These pad patterns and the corresponding lead patterns should be connected by, for example, gold wires by means of an automatic wire bonder. To do this, it is necessary to detect the position of each pad pattern and each lead pattern. To detect the position of each pad pattern and each lead pattern, a part of the corresponding element pattern should first be identified.

There are, however, problems in the conventional pattern recognition methods, as mentioned before. Briefly, the problems are derived from the following:

(a) The surfaces of the lead patterns are too rough to be recognized by a TV camera in the conventional two methods when the lead patterns are formed by screen printing.

(b) The elements may be mounted on the substrate of the hybrid IC chip 1 with a small rotation angle during the manufacturing process. In such a case, it is difficult to recognize, in the conventional pattern matching method, the part of the element for identifying the desired pad pattern and the corresponding lead pattern.

(c) On each pad pattern and on each lead pattern, there is inevitably formed a production-prober's scratch, as denoted by a notation pp in FIG. 1. Other optical noise may also be formed on the patterns. These deteriorate the pattern recognition accuracy in the conventional methods.

(d) There are various shapes of element patterns on the hybrid IC substrate 1, as illustrated in FIG. 1. For the sake of simplicity, only five element patterns are illustrated in FIG. 1, however, in practice, there may be many more shapes of element patterns on the hybrid IC substrate 1. These various shapes are difficult to identify by the conventional feature extracting method.

Figure 2B:
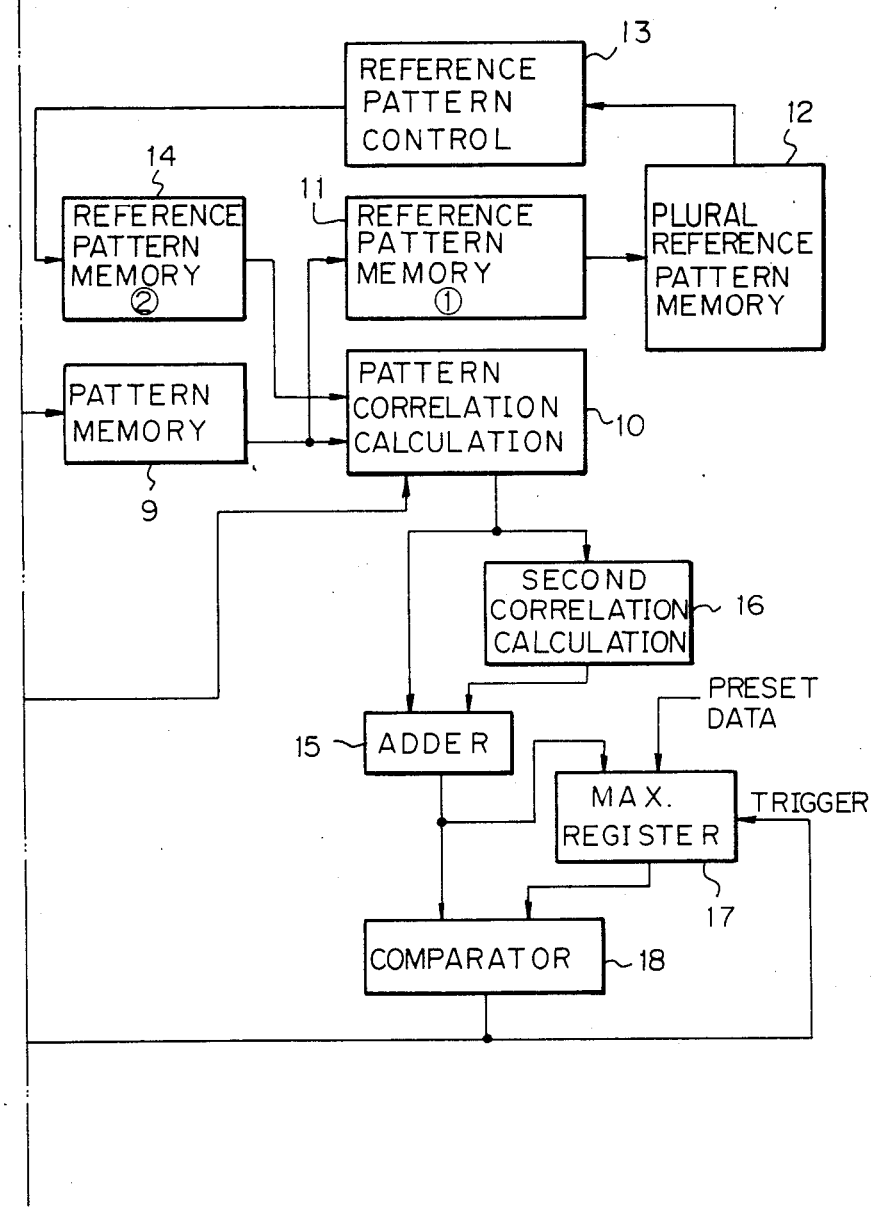
FIG. 2 is comprised of FIGS. 2A, 2B, which when laid adjacent one another present a block circuit diagram of a pattern recognition apparatus according to an embodiment of the present invention.

FIG. 2 is a block circuit diagram of a pattern recognition apparatus according to an embodiment of the present invention. In FIG. 2, reference numeral 2 represents an image pickup section, for example, a TV camera, for picking up an image of the patterns on the hybrid IC substrate 1 or on a reference sample. The image picked up by the TV camera 2 is transferred through a TV camera driver 4 to an analog-digital (A/D) converter 5. The TV camera driver 4 is controlled by a clock generator 3.

The A/D converter 5 converts (i.e., quantizes) the picked-up image signals into digitized image pattern data consisting of binary-coded signals, i.e., digital signals. The digital signals produced by the A/D converter 5 are stored in a frame memory 6 which operates synchronously with the operation of the TV camera 2 to store the digital signals, maintaining the shape of the picked-up image of the pattern on the hybrid IC substrate 1. Since an image represented by the digital signals consists of $A \times B$ bits (A and B are integers), for example, 256 (X-axis)$\times$256 (Y-axis) bits, the frame memory 6 has a memory capacity corresponding to one digitized image, i.e., $A \times B$ bits, for example $256 \times 256$ bits.

The digital signals stored in the frame memory 6 are supplied to a data compaction circuit 7.

The data compaction circuit 7 converts a predetermined number of neighboring bits of the digital signals taken out from the frame memory 6 into a single bit. This conversion is carried out in such a manner that each of a plurality of small sub-images each consisting of $c \times c$ bits (c is an integer smaller than N or M), for example, $4 \times 4$ bits, in the digital signals of the image consisting of $A \times B$ bits, for example, $256 \times 256$ bits, are converted into a single bit, and, the sign of the single bit is determined in accordance with the number of "1" or "0" signals in the each small sub-image consisting of $c \times c$ bits, for example, $4 \times 4$ bits. That is, in the above example when, for example, eight or more "1" signals are included in the small sub-image, the converted single bit is assigned "1"value, and when the number of "1" signals is less than eight, the converted single bit is assigned a binary value of "0". Thus, the data compaction circuit 7 outputs the compacted digitized image pattern data consisting of $N \times M$ bits (N and M are integers smaller than A and B), for example, $64 \times 64$ bits. This data compaction shortens the time required for data processing.

The output of the data compaction circuit 7 is connected to a pattern memory circuit 9 having a memory capacity of $N \times M$ bits. The output of the pattern memory circuit 9 is connected to a first input of a pattern correlation calculating circuit 10 and to the input of a first reference pattern memory circuit 11.

Under the control of a control circuit (not shown), reference pattern data is stored in the first reference pattern memory circuit 11 before picking up the image of the patterns to be recognized. The reference pattern data stored in the first reference pattern memory 11 is obtained from compacted image pattern data of the patterns on the hybrid IC substrate 1 to be recognized. The reference pattern data corresponding to one reference pattern consists of $n \times m$ bits (n and m are integers smaller than N and M respectively), for example, $24 \times 24$ bits.

There are a plurality of reference patterns on the reference sample. Therefore, a plurality of reference pattern data should be stored. A plural reference pattern memory circuit 12 is therefore constructed so as to store the plurality of reference pattern data, each of which is supplied from the first reference pattern memory circuit 11. A reference pattern control circuit 13 controls the plural reference pattern memory circuit 12 to output therefrom each necessary reference pattern and to store it into a second reference pattern memory circuit 14 under the control of the reference pattern controller 13. The output of the second reference pattern memory circuit 14 is connected to a second input of the pattern correlation calculating circuit 10.

The pattern correlation calculating circuit 10 calculates first correlations between the compacted image pattern data and a sub-image consisting of $n \times m$ bits, for example, $24 \times 24$ bits of the reference pattern data, in accordance with clock signals supplied from the clock generator 3. The output of the pattern correlation calculating circuit 10 is connected to a first input of an adder 15 and to the input of a second correlation calculating circuit 16. The output of the second correlation calculating circuit 16 is connected to a second input of the adder 15. The pattern correlation calculating circuit 10 and the second correlation calculating circuit 16, which constitute a main body of the present invention, will be described later in detail with reference to FIG. 3.

The output of the adder 15 is connected to the input of a maximum value storing register 17 and to the input of a comparator 18. In the maximum value storing register 17, a preset data value is stored before picking up of the image of the patterns to be recognized. When the output value of the adder 15 is greater than the value stored in the maximum value storing register 17, the contents of the maximum-value storing register 17 are updated to equal the output value of the adder 15 by providing a trigger from the comparator 18 to the maximum value storing register 17, and, the address at that time is stored into an address register 19 by providing a trigger to the address register 19.

The output of the address register 19 is connected to a view-window determining circuit 20. The view-window determining circuit 20 calculates the addresses of a view window for taking out a small sub-image of the image pattern data from the frame memory 6, after all bits in the pattern memory circuit 9 have been processed by the pattern correlation calculating circuit 10 and by the second correlation calculating circuit 16. Thus, the small sub-image taken out from the frame memory 6 includes the data corresponding to that data which provides the maximum value stored in the maximum value storing register 17 after all bits in the pattern memory circuit 9 are processed. In other words, the small sub-image taken out from the frame memory 6 includes the image pattern data of a pattern to be recognized which matches with the reference pattern.

Since a pattern to be recognized for wire bonding has a size of for example 100 $\mu m \times 100$ $\mu m$, the view window is determined to have a size of 200 $\mu m \times 200$ $\mu m$, for example, which is greater than the pattern size. The X and Y axis resolution of the TV camera 1 is for example 5 $\mu m/1$ bit. Therefore, the small sub-image taken out from the frame memory 6 has a size of $40 \times 40$ bits in this example.

The small sub-image of $40 \times 40$ bits is transferred through the view-window determining circuit 20 to a middle-point detecting circuit 21, in which the middle point of the pattern to be recognized is calculated. It should be noted that, since the data of the small sub-image taken out from the frame memory 6 are not compacted, the detected middle point has a high accuracy when compared with the address stored in the address register 19.

The output of the middle-point detecting circuit 21 is connected to a control circuit (not shown). By the output of the control circuit, a wire bonding operation is carried out on the determined middle point of the pattern.

Figure 3:
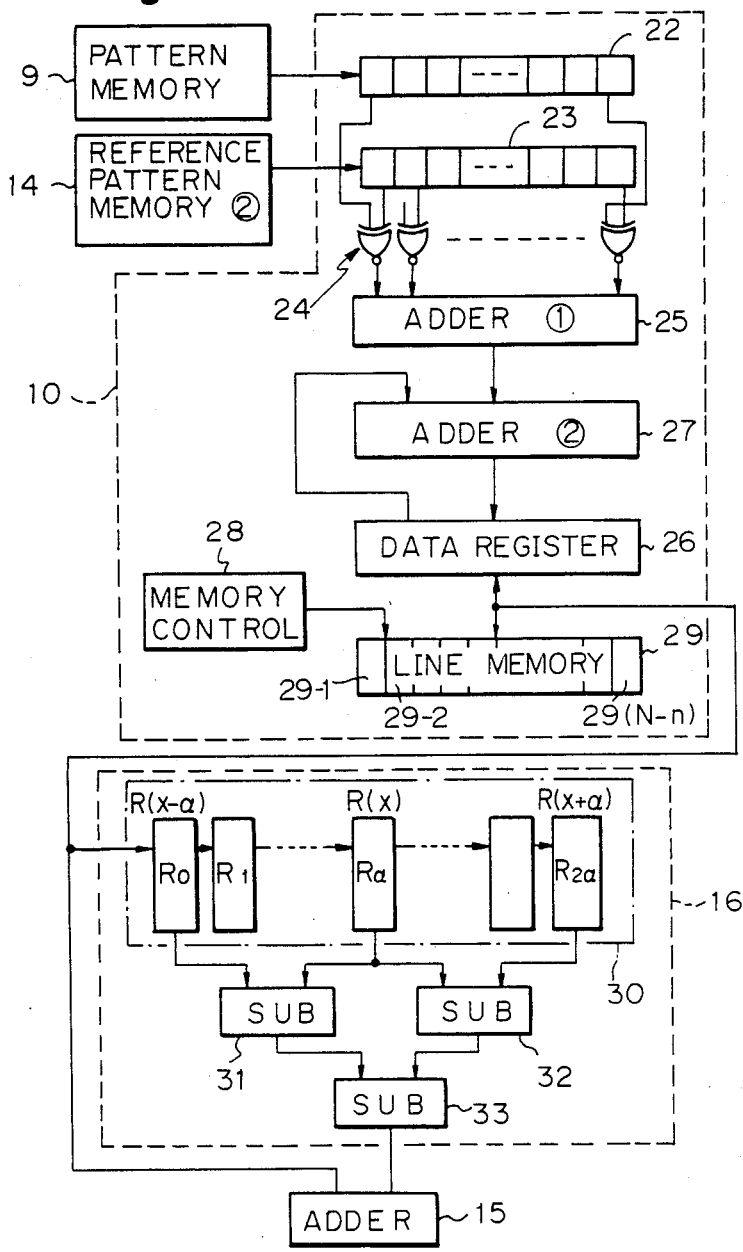
FIG. 3 is a more detailed block circuit diagram of part of FIG. 2.

FIG. 3 is a detailed block circuit diagram of the pattern correlation calculating circuit 10 and the second correlation calculating circuit 16. In FIG. 3, the pattern correlation calculating circuit 10 comprises a first n-bit or 24-bit shift register 22 connected to the pattern memory circuit 9, a second n-bit or 24-bit shift register 23 connected to the second reference pattern memory circuit 14, a plurality of ENOR (Exclusive NOR) gates 24 each having a first input connected to one of the n locations in the first n-bit shift register 22 and a second input connected to one of the n locations in the second n-bit shift register 23, a first adding circuit 25 having inputs connected to the outputs of the ENOR gates 24, a data register 26, a second adding circuit 27 having a first input connected to the output of the first adding circuit 25 and a second input connected to the output of the data register 26, the output of the second adding circuit 27 being connected to the input of the data register 26, a memory control circuit 28, and a line memory circuit 29 having a plurality of first-correlation storing regions 29-1, 29-2, ---29-(N−n). Each of the locations in the first n-bit shift register 22 corresponds to one of the locations in the second n-bit shift register 23.

The second correlation calculating circuit 16 comprises a predetermined number of registers $R_0$, $R_1$, --- $R_\alpha$, --- $R_{2\alpha}$ in a register storing portion 30, a first subtracting circuit 31 for subtracting the contents in the register $R_0$ from the contents in the register $R_\alpha$, a second subtracting circuit 32 for subtracting the contents in the register $R_\alpha$ from the contents in the register $R_{2\alpha}$, and a third subtracting circuit 33 for subtracting the output of the second subtracting circuit 32 from the output of the first subtracting circuit 31.

The number $\alpha$ is determined in accordance with the size of the pattern to be recognized. The lead pattern or the pad pattern to be recognized for wire bonding has a size of for example 100 $\mu m \times 100$ $\mu m$. One compacted bit, when $4 \times 4$ bits are compacted to one compact bit, represents a 20 $\mu m \times 20$ $\mu m$ (5 $\mu m \times 4 \times 4$ bits) area of the image. Therefore, a 100 $\mu m \times 100$ $\mu m$ is expressed by 5 compacted bits. In this case, the predetermined number $\alpha$ is determined to be equal to 5. Generally, when the size of the pattern to be recognized is 1 $\mu m \times 1$ $\mu m$ and when $c \times c$ bits of the original uncompacted image pattern data are compacted to one compacted bit, the predetermined number $\alpha$ is determined to be equal to $1/5c$, where the equivalent resolution of the TV camera 1 in the x and y axes is 5 $\mu m$/bit.

The line memory circuit 29 has an input/output terminal connected to the first input of the adder 15. The output of the third substracting circuit 33 is connected to the second input of the adder 15.

The operation of the pattern correlation circuit 10 and the second correlation calculating circuit 16 shown in FIG. 3 will now be described with reference to FIGS. 4, 5A, 5B, 5C, and 5D.

Figure 4:
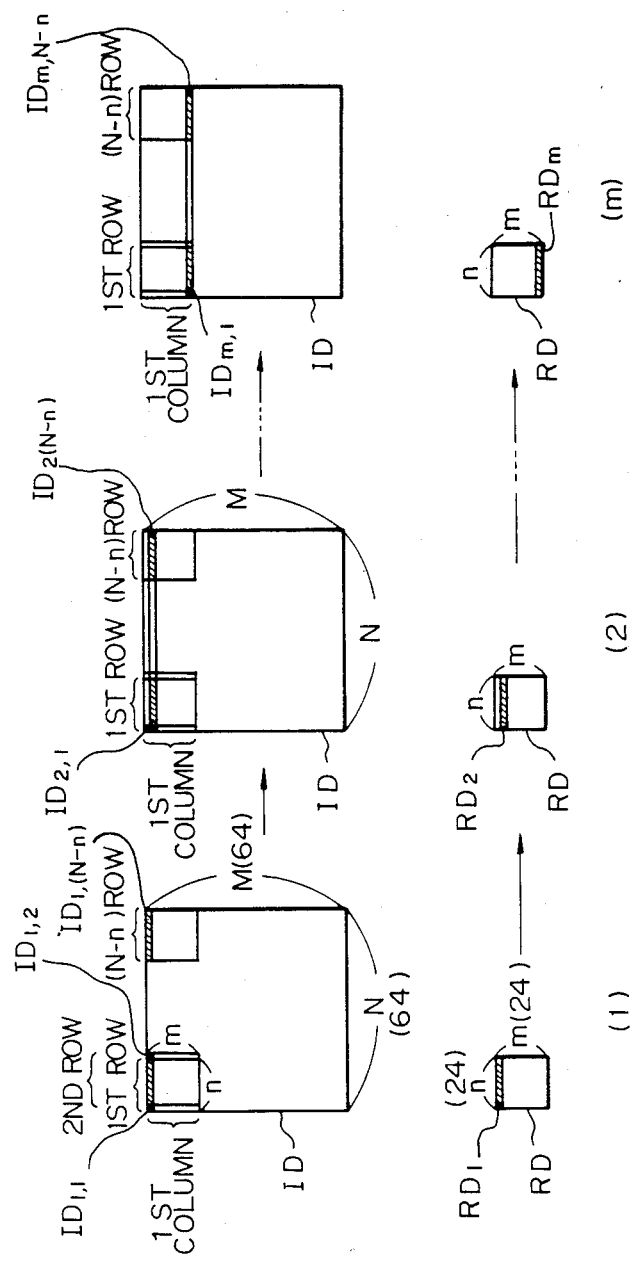
FIG. 4 is a schematic diagram of an image pattern data in one column and a reference pattern data for explaining the process of obtaining first correlations therebetween by the circuit of FIG. 2.

After storing a compacted reference pattern data into the second reference pattern memory circuit 14, the hybrid IC substrate 1 is moved into the visual field of the TV camera 2 and after digitized and compacting the image pattern data consisting of $N \times M$ compacted bits, for example, $64 \times 64$ bits are stored in the pattern memory circuit 9, as described before. In FIG. 4, RD shows the compacted reference pattern data consisting of $n \times m$ bits, or for example $24 \times 24$ bits, stored in the second reference pattern memory circuit 14, and ID shows the compacted image pattern data consisting of $N \times M$ bits, for example, $64 \times 64$ bits, stored in the pattern memory circuit 9. The image pattern data ID is compared with the reference pattern data RD so as to detect the position of a sub-image of the image pattern data ID most identical to the reference pattern data RD. The image pattern data ID consists of $(M-m)$ columns (i.e. matrices) each consisting of $N \times m$ bits. The process of comparing the image pattern data ID with the reference pattern data RD comprises $(M-m)$ main steps. In each main step, one column is processed. Each column consists of m sub-columns (i.e., sub-matrices) each consisting of $N \times 1$ bits. Each main step comprises m steps. In each step, one sub-column consisting of $N \times 1$ bits is processed.

FIG. 4 illustrates the first main step for processing the first column of $N \times m$ bits.

The first step in the first main step is shown in the left portion of FIG. 4. During the first step, the first-column reference pattern data $RD_1$ are input into the second n-bit shift register 23 (FIG. 3). The first step comprises $(N-n)$ sub-steps.

In the first sub-step of the first step a, first sub-image data $ID_{1,1}$ consisting of n bits in the first sub-column of the image pattern data ID, are input into the first n-bit shift register 22 (FIG. 3), by means of a view window in the pattern memory circuit 9. That is, the view window can provide n bits in one of the sub-columns. Each of the ENOR gates 24 outputs a "1" when the data stored in the corresponding locations of the first n-bit shift register 22 and the second n-bit shift register 23 coincide, that is, when "1" and "1" or "0" and "0" are input to the ENOR gate 24. The first adding circuit 25 calculates the number of "1"s output from the ENOR gates 24. The calculated number of "1"s is a first correlation between the first data sub-matrix $ID_{1,1}$ stored in the first n-bit shift register and the reference pattern data sub-matrix $RD_1$ stored in the second n-bit shift register. Before obtaining the first correlation, the contents of the second adding circuit 27, the data register 26, and the line memory circuit 29 are cleared to zero. Thus, the first correlation obtained at the output of the first adding circuit 25 is stored, under the control of the memory control circuit 28, into the first-correlation storing region 29-1, which is allocated for the first row consisting of n×M bits in the image pattern data ID.

In the second sub-step, a second data sub-matrix $ID_{1,2}$ consisting of n bits in the first sub-column and in the second row are stored in the first n-bit shift register 22. That is, the view window in the pattern memory circuit 9 is shifted by one bit in the first sub column to provide the second data sub-matrix $ID_{1,2}$ to the first n-bit shift register 22. The first adding circuit 25 calculates a first correlation between the second data sub-matrix $ID_{1,2}$ and the reference pattern data sub-matrix $RD_1$. The calculated first correlation is stored in the first-correlation storing region 29-2, which is allocated for the second row consisting of n×M bits in the image pattern data ID. It will be seen from FIG. 4 that the second row is shifted from the first row by one bit in the column direction.

Similar operations as in the first and second sub-steps mentioned above are carried out in the remaining sub-steps. After the (N−n)th sub-step in the first step, first correlations between (N−n) rows in the first sub-column of the image pattern data ID and the first column of the reference pattern data are stored in the first-correlation storing regions 29-1, 29-2, --- 29 (N−n), respectively.

The second step in the first main step is shown in the middle portion of FIG. 4. During the second step, the second-column reference pattern data sub-matrix $RD_2$ are stored in the second n-bit shift register 23. The second step also comprises (N−n) sub-steps.

In the first sub-step of the second step, a first data sub-matrix $ID_{2,1}$ in the second sub-column and in the first row of the image pattern data ID and the second-column reference pattern data sub-matrix $RD_2$ are compared. The first correlation therebetween is calculated in the first adding circuit 25 in a similar way as in the first step. The second adding circuit 27 adds the previously obtained first correlation stored in the first-correlation storing region 29-1 to the first correlation obtained at the output of the first adding circuit 25 in this second sub-step. The added result is stored in the first-correlation storing region 29-1.

Similar operations as in the first sub-step of the second step are carried out in the remaining sub-steps. The added results are stored in the first-correlation storing regions 29-2, 29-3, --- 29-(N−n), respectively.

The third step and the following steps are similar to the above-mentioned second step.

It will be understood that, after the m-th step, that is, after the first main step, the first correlation between the n×m bits in the first column and in X-th row (where X=1, 2, --- or N−n) of the image pattern data ID, and the reference-pattern data RD, is stored in the first-correlation storing region 29-X.

Figure 5A:
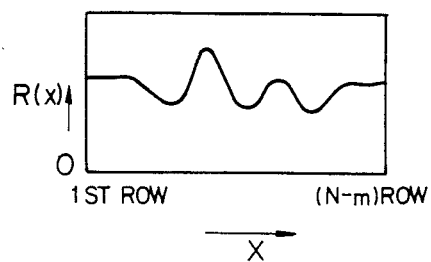
FIG. 5A is a graph of first correlations between one column of the image pattern data and one column of the reference pattern data shown in FIG. 4.

FIG. 5A is a graph of correlations between one column of the image pattern data ID and the reference pattern data, obtained in the above-mentioned one main step.

After one main step, the first-correlations R(X), where X=1, 2, --- N−n, stored in the first-correlation storing regions 29-1, 29-2, --- 29-(N−n) of the line memory circuit 29 are sequentially read out and sequentially shifted and loaded into the registers $R_0$, $R_1$, --- $R_\alpha$, --- $R_{2\alpha}$ in the register storing portion 30. In this loading operation, the registers $R_0$ through $R_{2\alpha}$ act as a shift register. The registers $R_0$, $R_\alpha$, and $R_{2\alpha}$ store first correlations $R(X-\alpha)$, $R(X)$, and $R(X+\alpha)$, respectively. The first subtracting circuit 31 calculates $[R(X)-R(X-\alpha)]$. The second subtracting circuit 32 calculates $[R(X+\alpha)-R(X)]$. The third subtracting circuit 33 calculates $[R(X)-R(X-\alpha)]-[R(X+\alpha)-R(X)]$. Thus, at the output of the third subtracting circuit 33, the second correlations expressed as $T(X)=[R(X)-R(X-\alpha)]-[R(X+\alpha)-R(X)]$ are obtained sequentially in time.

Figure 5B:
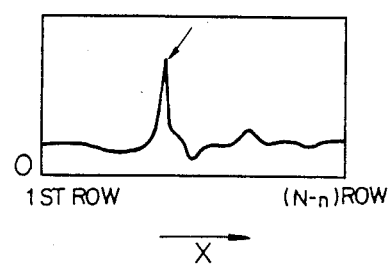
FIG. 5B is a graph of second correlations obtained from the first correlations of FIG. 5A, in which the maximum second correlation is emphasized over the first correlation by the circuit of FIG. 2.

The object of obtaining the second correlations T(X) is to emphasize the maximum value of the first correlations R(X). FIG. 5B is a graph of the second correlations T(X). As can be seen from FIG. 5B, the maximum value shown by an arrow is emphasized.

Figure 5C:
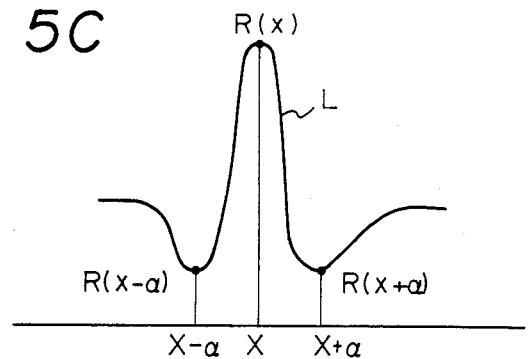
FIG. 5C is an enlarged view of a part of the graph of FIG. 5A, for explaining the method of obtaining the second correlations.

Since the predetermined number $\alpha$ is so determined as to be equal to 1/5c as described before, and since l is the side length of a pattern to be recognized, the relations among the first correlations R(X), $R(X-\alpha)$, and $R(X+\alpha)$ have a character as illustrated in FIG. 5C. That is, when the first correlation R(X) is one of the peak values in the graph of FIG. 5A, the first correlations $R(X-\alpha)$ and $R(X+\alpha)$ are bottom values on both sides of the peak value. Therefore, the second correlation emphasizes the maximum first correlation.

Figure 5D:
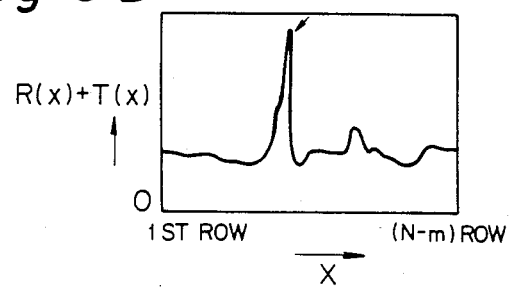
FIG. 5D is a graph of third correlations obtained from the first correlations of FIG. 5A and the second correlations of FIG. 5B, in which the maximum third correlation is emphasized over the first or the second correlation.

Experiments show that a preferable result is obtained by adding the first correlation R(X) and the second correlation T(X). Therefore, in the adder 15, the first correlation R(X) and the second correlation T(X) obtained during each clock period are added. The output waveform of the adder 15 is shown in FIG. 5D. As can be seen from FIG. 5D, the maximum value of the second correlation T(X) is further emphasized.

The maximum value of the outputs from the adder 15 is stored in the maximum-value storing register 17, and the address at that time is stored in the address register 19, as described before. Thus, the first main step is completed.

The remaining main steps are then carried out in a similar way as in the first main step described above. After all of the (M−m) main steps are completed, all of the image pattern data ID are processed, and, in the maximum-value storing register 17 and in the address register 19, the final maximum value and the address at the time when the final maximum value is output are stored respectively. In other words, the address of the image pattern data most identical to the reference pattern data is stored in the address register 19.

The operations of the view-window determining circuit 20 and of the middle-point detecting circuit 21 have already been described briefly. These circuits themselves are known (see, for example, Japanese Unexamined Patent Publication (Kokai) No. 57-111781 and U.S. Pat. No. 4,450,579. Therefore, detailed descriptions of these circuit operations are omitted. It should be noted, however, that the deterioration of resolution due to data compaction by the data compaction circuit 20 is compensated by the middle-point detecting circuit 21.

The determined middle point of a image pattern data is a point of a pad pattern or of a lead pattern which is then subjected to wire bonding.

The advantages or effects of obtaining the second correlations T(X) will be more apparent in the following explanation made with reference to FIGS. 6A, 7A and 8A and FIGS. 6B, 7B and 8B.

Figure 6A:
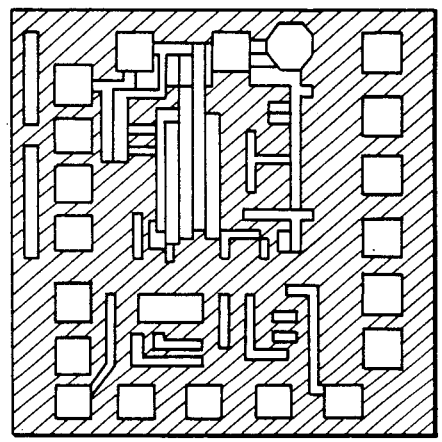
FIGS. 6A, 7A, and 8A are schematic magnified plan views of elements on the hybrid IC of FIG. 1.
Figure 6B:
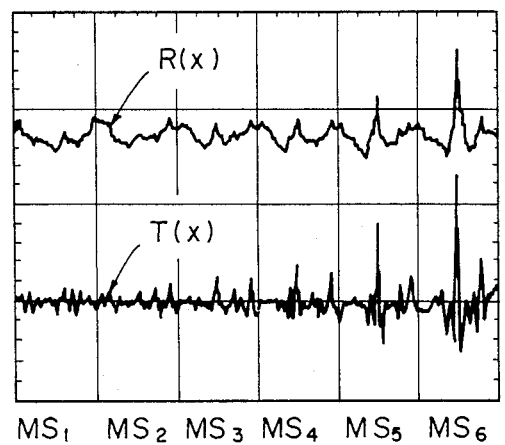
FIGS. 6B, 7B, and 8B are graphs of experimental values of first correlations and the second correlations of the respective elements of FIGS. 6A, 7A and 8A.
Figure 7A:
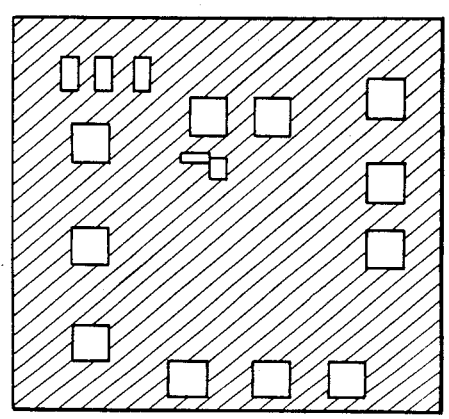
Figure 7B:
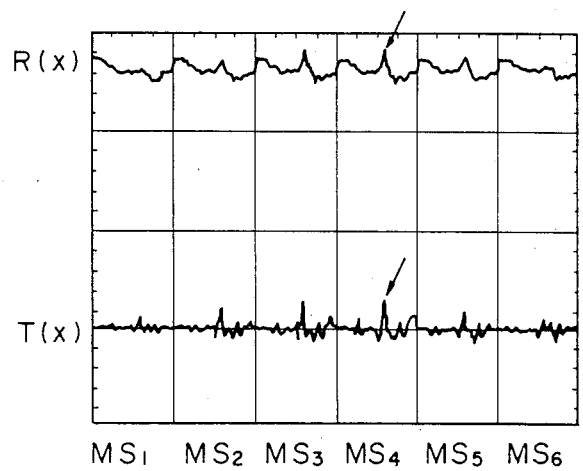
Figure 8A:
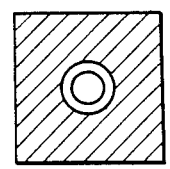
Figure 8B:
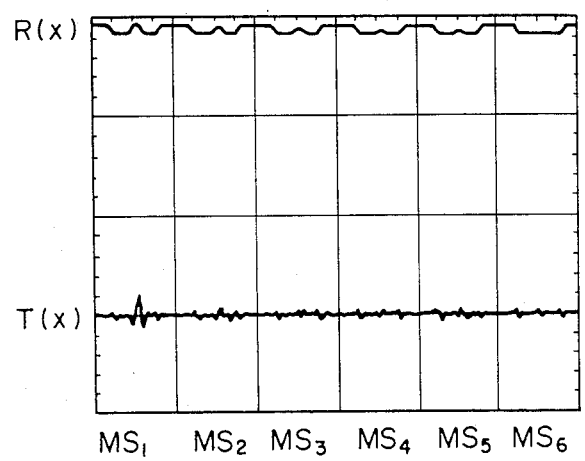

FIGS. 6A, 7A and 8A are schematic plan views of the elements on the hybrid IC substrate of FIG. 1, in which patterns are shown by non-hatched regions. FIGS. 6B, 7B and 8B are graphs of experimental waveforms of the first correlations and the second correlations of respective elements in FIGS. 6A, 7A and 8A.

In FIG. 6A, patterns on an IC are arranged at a relatively close density. In FIG. 6B, waveforms of first correlations R(X) and second correlations T(X) obtained by processing the image pattern data of the patterns of FIG. 6A during six main steps MS$_1$ through MS$_6$ are illustrated. As can be seen from FIG. 6B, the maximum value of the first correlations and the maximum value of the second correlations are detected in the sixth main step MS$_6$. Since the patterns in FIG. 6A are arranged in close density, the waveforms of the first correlations in the sixth main step are clearly distinguishable from the waveforms in the adjacent fifth main step. Therefore, in this case, the second correlations are not so advantageous. However, the maximum value of the first correlations R(X) is emphasized in the second correlation T(X).

FIG. 7A shows patterns on an other IC pattern. The patterns in FIG. 7A are arranged at a relatively low density. FIG. 7B shows waveforms of the first correlations R(X) and second correlations T(X) obtained by processing the image pattern data of the patterns of FIG. 7A during six main steps MS$_1$ through MS$_6$. Since the patterns in FIG. 7A are arranged at a low density, the waveforms of the first correlations in one main step are very similar to the other first correlations waveforms in the other main steps. Therefore, it is difficult to detect the maximum value of the first correlations throughout all of the main steps. The maximum value of the first correlations R(X) indicated by an arrow in FIG. 7B is, however, emphasized in the second correlations T(X).

FIG. 8A shows a pattern of a diode. FIG. 8B shows waveforms of the first correlations R(X) and second correlations T(X) obtained by processing the image pattern data of the pattern of FIG. 8A during six main steps MS$_1$ through MS$_6$. Since the pattern in FIG. 8A is very simple and arranged at a low density, the same advantage is obtained as in the case of FIG. 7A described above with reference to FIG. 7B.

The advantages or effects of the data compaction carried out by the data compaction circuit 7 will be more apparent from the following explanation made with reference to FIGS. 9A, 10A, 11A and 12A and FIGS. 9B, 10B, 11B and 12B.

Figure 9A:
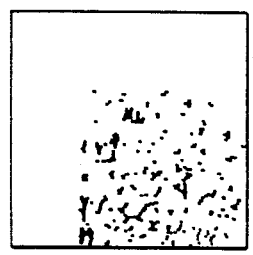
FIG. 9A shows a lead pattern image in which data is not compacted.
Figure 10A:
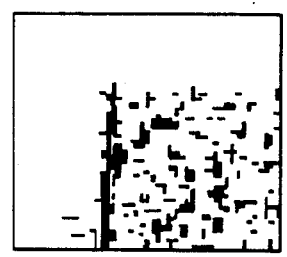
FIG. 10A shows a lead pattern image as of FIG. 9A in which two neighboring bits are compacted to a single bit.
Figure 9B:
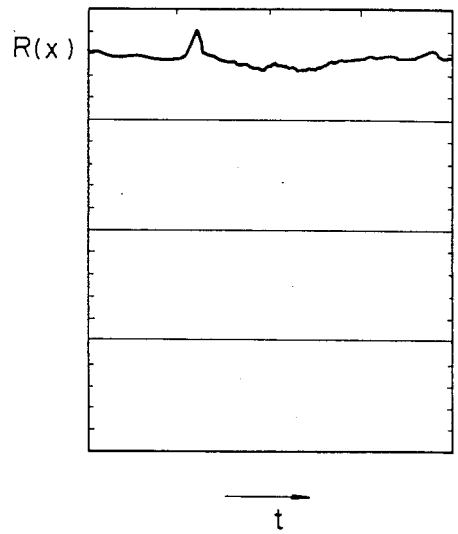
FIG. 9B is a graph of the first correlations of the lead pattern image of FIG. 9A.
Figure 10B:
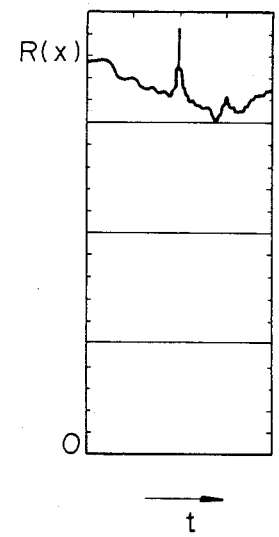
FIG. 10B is a graph of the first correlations of the lead pattern image of FIG. 10A.
Figure 11A:
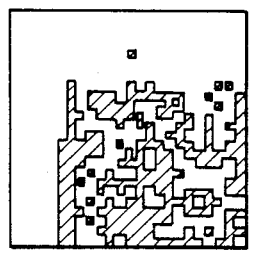
FIG. 11A shows a lead pattern image as of FIG. 9A, but in which four neighboring bits are compacted to a single bit.
Figure 12A:
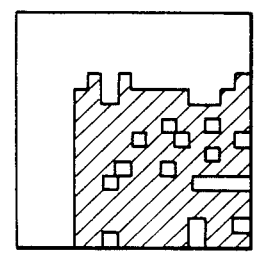
FIG. 12A shows a lead pattern image of FIG. 9A in which 16 neighboring bits are compacted to a single bit.
Figure 11B:
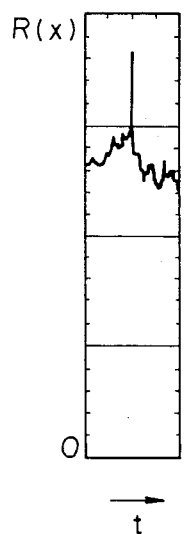
FIG. 11B is a graph of the first correlations of the lead pattern image as of FIG. 11A.
Figure 12B:
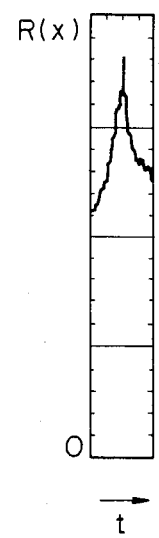
FIG. 12B is a graph of the first correlations of the lead pattern image of FIG. 12A.

FIGS. 9A, 10A, 11A and 12A illustrate image patterns of a lead pattern formed by printing. FIG. 9A illustrates an image pattern which is not compacted. Therefore, one picture element in FIG. 9A represented a pattern area of 5 $\mu$m$\times$5 $\mu$m as an example. FIG. 9B illustrates a compacted image pattern of the lead pattern, in which 2$\times$2 bits are compacted to a single bit. Therefore, one picture element in FIG. 9B represents a pattern area of 10 $\mu$m$\times$10 $\mu$m as an example. FIG. 9C illustrates a further compacted image pattern in which 4$\times$4 bits are compacted to a single bit. Therefore, one picture element in FIG. 9C represents a pattern area of 20 $\mu$m$\times$20 $\mu$m as an example. FIG. 9D illustrates a still further compacted image pattern in which 6$\times$6 bits are compacted to a single bit. Therefore, one picture element in FIG. 9D is 30 $\mu$m$\times$30 $\mu$m as an example. Accordingly, the resolution of the image pattern is deteriorated along with the increase in the compaction degree. The deteriorated resolution, however, is compensated, as described before, by the middle-point detecting circuit 21.

On the other hand, the amount of the image pattern data of the lead pattern is reduced to $1/c^2$, for example, $\frac{1}{4}$, 1/16, and 1/36, in accordance with the data compactions. This shortens the data processing time t for obtaining the first and the second correlations. This advantage will be seen from FIGS. 9B, 10B, 11B and 12B, which are graphs of the first correlations R(x) of the lead pattern images of FIGS. 9A, 10A, 11A and 12A, respectively.

Further, since the surface of the printed lead pattern is uneven, or is not as smooth as a pad pattern formed by metal evaporation, and since the unevenness is randomly formed, the maximum value of the first correlations for the lead pattern is emphasized when image pattern data are compacted, as can be seen from FIGS. 9B through 12B.

The present invention is not restricted to the above described embodiment. Various changes and modifications are possible without departing from the spirit of the present invention. For example, the data compaction process may be eliminated in the pattern recognition process. In this case, the reference pattern data are, of course, not compacted.

From the foregoing description, it will be apparent that, according to the present invention, by combining an improved pattern matching method and a feature extracting method, the possibility of an error in detection of the position of a pattern laid on an object is greatly reduced, even when the pattern is a lead pattern formed by printing, the pattern is mounted with a small rotation angle with respect to a reference pattern, the pattern has scratches or optical noise, or the pattern includes various shapes of patterns on an object, such as in a hybrid IC.

Further, the introduction of the data compaction process into the process recognition pattern greatly reduces the data processing time to $1/c^2$.

As a result, the pattern recognition apparatus and method are effective for an automatic wire bonding operation for a semiconductor device.

We claim:
1. A pattern recognition apparatus comprising:
   an image pickup section for picking up an image of patterns;
   a pretreated circuit for converting an output signal of said image pickup section into image pattern data consisting of binary-coded signals;

a pattern memory circuit having $N \times M$ addresses for storing $N \times M$ bits of said image pattern data, where M and N are integers;

a reference pattern memory circuit having at least $n \times m$ addresses for storing reference pattern data consisting of $n \times m$ bits of a reference pattern, where m and n are integers smaller than M and N respectively;

a first correlation calculating circuit for calculating first correlations between sub-images each consisting of $n \times m$ bits of said image pattern data and said reference pattern data, respectively, each of said first correlations being expressed as R(X), where X is a variable factor representing a memory region storing one of said image pattern data sub-images in said pattern memory circuit; and a second correlation calculating means for recognizing the position of a pattern most identical to said reference pattern, by emphasizing the maximum value of said first correlations by converting each of said first correlations R(X) into a second correlation expressed as $[R(X) - R(X - \alpha)] - [R(X + \alpha) \times R(X)]$, where $\alpha$ is a predetermined value determined in accordance with the size of said reference pattern data.

2. A pattern recognition apparatus as set forth in claim 1, wherein, said first correlation calculating circuit comprises;

a first n-bit shift register for storing n bits of one of said parts, said n bits being output from a column of said pattern memory circuit, said column having addresses from (X, Y+y) to (X+n, Y+y), where X, Y, and y are variable integers under the conditions $1 \leq X \leq N - n$, $1 \leq Y \leq M - m$, and $1 \leq y \leq m$;

a second n-bit shift register for storing n bits of said reference pattern data, said n bits being output from a column of said reference pattern memory, said column having addresses from (1, y) to (n, y);

a matching-bit detecting circuit for detecting coincidences between said n bits of said image pattern data stored in said first n-bit shift register and said n bits of said reference pattern data stored in said second n-bit shift register in a bit-to-bit fashion, so as to provide matching-bit signals with respect to said n bits of said image pattern data;

a first adder for summing the number of said matching-bit signals with respect to said column having addresses from (X, Y+y) to (X+n, Y+y);

a second adder for adding the output of said first adder to a previously-obtained number of matching-bit signals with respect to columns having addresses from (X, Z) to (X+n, Z), where Z represents a variable integer smaller than the integer Y+y, so as to provide a first correlation between $m \times y$ bits of said image pattern data stored in the addresses from (X, Y) to (X+n, Y+y) in said one of said parts stored in said pattern memory circuit and $n \times y$ bits of said reference pattern data stored in the addresses (1, 1) to (n, y) of said reference memory circuit; and a line memory circuit having a plurality of first-correlation storing regions for storing the outputs of said second adder, said correlation storing regions being adapted to store the resultant first correlations R(1), R(2), ---, R(X), ---, R(N−n), respectively, where R(X) is the first correlation with respect to $n \times m$ bits of said image pattern data in the addresses from (X, Y) to (X+n, Y+m).

3. A pattern recognition apparatus as set forth in claim 2, wherein said first n-bit shift register and said second n-bit shift register each comprises n locations each for storing one bit.

4. A pattern recognition apparatus as set forth in claim 3, wherein, said matching-bit detecting circuit comprises ENOR circuits, each of said ENOR circuits having a first input connected to one of said locations in said first n-bit shift register and a second input connected to one of said locations in said second n-bit shift register, said one of said locations in said first n-bit shift register corresponding to said one of said locations in said second n-bit shift register.

5. A pattern recognition apparatus as set forth in claim 4, wherein, said first correlation calculating circuit further comprises a memory control circuit for controlling the input operation and the output operation of said line memory circuit, whereby the outputs of said line memory circuit are supplied to said second adder after said first adder outputs said number of said matching-bit signals.

6. A pattern recognition apparatus as set forth in claim 5, wherein, said first correlation calculating circuit further comprises a data register for temporarily storing the outputs of said second adder or of said line memory circuit.

7. A pattern recognition apparatus as set forth in any one of claims 1 through 6, wherein said position recognizing means comprises a first subtracting circuit for calculating $[R(X) - R(x - \alpha)]$, a second subtracting circuit for calculating $[R(X + \alpha) - R(X)]$, and a third subtracting circuit for subtracting the output of said second subtracting circuit from the output of said first subtracting circuit.

8. A pattern recognition apparatus as set forth in claim 7, wherein said second correlation calculating means further comprises a maximum-value storing register for storing the maximum value of the outputs of said third subtracting circuit, and a comparator for comparing each output from said third subtracting circuit with said maximum value previously stored in said maximum-value storing register, so as to provide a trigger to said maximum-value storing register to update the contents of said maximum-value storing register into the output of said comparator when the output value of said third subtracting circuit is greater than the stored maximum value.

9. A pattern recognition apparatus as set forth in claim 8 further comprising a data compaction circuit inserted between said pretreatment circuit and said pattern memory circuit, for compacting a predetermined number of neighboring bits of said binary-coded signals into a single bit, the sign of said single bit being determined in accordance with the number of "1" or "0" signals in said neighboring bits, so as to provide compacted image pattern data to said pattern memory circuit.

10. A pattern recognition apparatus as set forth in claim 9, further comprising:

an address register for storing an address of said image pattern data in response to said trigger from said comparator, whereby, said address register is adapted to store the address of the image pattern data which provides the maximum value at the output of said third subtracting circuit;

a view-window determining circuit connected to the output of said address register, for calculating the position of a view window for taking out a small sub-image of said image pattern data from said pretreatment circuit, said small sub-image including the data which provides the maximum value stored in said maximum-value storing register after all bits of said first sub-image of said image pattern data are processed by said first correlation calculating circuit and by said second correlation calculating means, the calculation of the position of said view window being carried out by using said address stored in said address register; and a middle-point detecting circuit connected to the output of said view window determining circuit, for detecting the middle point of a pattern in said small sub-image.

11. A pattern recognition method comprising the steps of:

picking up an image of patterns, converting the picked-up image into image pattern data consisting of binary-coded signals, storing N×M bits of said image pattern data, where M and N are integers;

storing reference pattern data consisting of at least n×m bits of a reference pattern, where m and n are integers smaller than M and N, respectively;

calculating first correlations between sub-images each consisting of n×m bits of said image pattern data and said reference pattern data, respectively each of said first correlations being expressed as $R(X)$, where X is a variable factor representing a region storing one of said second parts; and recognizing the position of a pattern most identical to said reference pattern, by emphasizing the maximum value of said first correlations by converting each of said first correlations $R(X)$ into a second correlation expressed as $[R(X)-R(X-\alpha)]-[R(X+\alpha)-R(X)]$, where $\alpha$ is a predetermined value determined in accordance with the size of said reference pattern data.

12. A pattern recognition method as set forth in claim 11, wherein said step of calculating first correlations comprises the steps of:

storing n bits of one of said parts into a first n-bit shift register, said n bits being output from a column in said one of said parts having addresses from (X, Y+y) to (X+n, Y+y), where X, Y, and y are variable integers under the conditions $1 \leq X \leq N-n$, $1 \leq Y \leq M-m$, and $1 \leq y \leq m$;

storing n bits of said reference pattern data into a second n-bit shift register, said n bits being output from a column in said reference pattern data having addresses from (1, y) to (n, y);

detecting coincidences between said stored n bits of said image pattern data and said stored n bits of said reference pattern data in a bit-to-bit fashion, so as to provide matching-bit signals with respect to said n bits of said image pattern data;

summing the number of said matching-bit signals with respect to said column in said one of said parts;

adding the result of said first adding to a previously-obtained number of matching-bit signals with respect to columns having addresses from (X, Z) to (X+n, Z), where Z represents a variable integer smaller than the integer Y+y, so as to provide a first correlation between n×y bits of said image pattern data having addresses from (X, Y) to (X+n, Y+y) in said one of said parts and n×y bits of said reference pattern data; and storing the result of said adding step into a plurality of correlation storing regions for storing the resultant correlations $R(1)$, $R(2)$, ---$R(X)$, --- $R(N-n)$, respectively, where $R(X)$ is the first correlation with respect to n×m bits of said image pattern data in the address from (X, Y) to (X+n, Y+m).

13. A pattern recognition method as set forth in claim 12, wherein said step of recognizing the position of a pattern comprises the steps of:

storing the maximum value of said correlations;

comparing each of said second correlations with said maximum value which has previously been stored; and updating said stored maximum value to equal said second correlations when said second correlation is greater than said stored maximum value.

14. A pattern recognition method as set forth in claim 13, wherein, said step of converting the picked-up image into image pattern data consisting of binary-coded signals is followed by the step of:

compacting a predetermined number of neighboring bits of said binary-coded signals into a single bit, the sign of said single bit being determined in accordance with the number of "1" or "0" signals in said neighboring bits, so as to provide compacted image pattern data.

15. A pattern recognition method as set forth in claim 14, wherein said step of updating said stored maximum value into said second correlation is followed by the step of:

storing an address of said image pattern data into an address register when said image pattern data provides the maximum value of said second correlations;

calculating the position of a view window for taking out a small sub-image of said image pattern data from said pretreatment circuit, said small sub-image including the data which provides the maximum value of said second correlations after all bits of said first sub-image of said image pattern data are processed in said step of calculating first correlations and in said step of recognizing the position of a pattern; and detecting a middle point of a pattern in said small sub-image.

* * * * *